United States Patent
Carroll et al.

(10) Patent No.: US 6,254,437 B1
(45) Date of Patent: Jul. 3, 2001

(54) UTILITY METERING TRANSOCKET

(75) Inventors: L. J. Carroll, Collierville, TN (US); Walter Jeffcoat, Vidalia, GA (US)

(73) Assignee: Thomas & Betts International, Sparks, NV (US)

( * ) Notice: Subject to any disclaimer, the term of this patent is extended or adjusted under 35 U.S.C. 154(b) by 0 days.

(21) Appl. No.: 09/243,662

(22) Filed: Feb. 2, 1999

(51) Int. Cl.$^7$ ..................................................... H01R 9/22
(52) U.S. Cl. ................................................ 439/709; 439/719
(58) Field of Search ................................ 439/709, 517, 439/717, 719; 361/627

(56) References Cited

U.S. PATENT DOCUMENTS

| | | |
|---|---|---|
| 850,174 | 4/1907 | McWilliams . |
| 3,221,216 * | 11/1965 | Kobryner ............................ 439/704 |
| 3,562,695 | 2/1971 | Shackford ............................ 339/31 |
| 3,716,762 | 2/1973 | Shrader ................................ 317/107 |
| 3,744,010 * | 7/1973 | Meacham ............................ 439/345 |
| 3,764,956 * | 10/1973 | Norden ................................ 439/259 |
| 3,895,179 | 7/1975 | Wyatt .................................... 174/50 |
| 4,025,825 | 5/1977 | Shrader ................................ 361/374 |
| 4,404,521 | 9/1983 | Fennell ................................. 324/110 |
| 4,731,501 | 3/1988 | Clark et al. ............................ 174/65 |
| 4,741,032 | 4/1988 | Hampton ............................ 379/399 |
| 4,998,612 | 3/1991 | Halsey et al. ........................ 194/350 |
| 5,088,004 | 2/1992 | Howell ................................ 361/373 |
| 5,121,824 | 6/1992 | Halsey et al. ........................ 194/350 |
| 5,334,057 | 8/1994 | Blackwell ............................ 439/839 |
| 5,383,090 * | 1/1995 | Freundner et al. .................... 361/624 |
| 5,404,266 * | 4/1995 | Orchard et al. ...................... 361/667 |
| 5,588,874 | 12/1996 | Pruehs et al. ........................ 439/517 |
| 5,712,769 | 1/1998 | Ruque ................................ 361/796 |
| 5,715,144 | 2/1998 | Ameen et al. ...................... 361/790 |
| 5,721,671 | 2/1998 | Ruque ................................ 361/796 |
| 5,870,276 * | 2/1999 | Leach et al. ........................ 361/627 |

* cited by examiner

*Primary Examiner*—Lincoln Donovan
*Assistant Examiner*—Brian S. Webb
(74) *Attorney, Agent, or Firm*—G. Andrew Barger

(57) ABSTRACT

A utility metering transocket for mounting to a wall and for receiving a line wire and a load wire therein. The transocket has a bottom side, a back side, a top side, a top cover at least partially covering the back side, and opposing sides coupled to the bottom, back, and top sides. A plurality of bus bars of differing length are mounted to the back side, each bus bar having a load connector and a spaced apart line connector secured thereon. The plurality of bus bars are further arranged toward one of the opposing sides of the transocket thereby providing increased space within the transocket for routing the line wire and the load wire within the transocket such that the line wire and the load wire can be gradually bent for coupling to the line connector and the load connector, respectively, of at least one of the plurality of bus bars. Rotating line and load connectors are disposed on the bus bars to further aiding in routing. A two-part connector is mounted on the side of the transocket for easily removing the meter and associated wires for working within the transocket.

21 Claims, 12 Drawing Sheets

UTILITY METERING TRANSOCKET

FIELD OF THE INVENTION

In general, the present invention relates to electrical junction boxes and, in particular, the present invention relates to an improved utility metering transocket.

BACKGROUND

Present transockets have bus bars of equal length that are mounted therein and are spaced at equal distances. On one end of the bus bars is a line connector and the other end a load connector. Great routing difficulty is encountered if a line wire is introduced into the transocket from below, such as from a ground feed, and must be run to the top of the bus bars for connection to one of the line connectors. This results in multiple bends of the line wire, which could break the insulation or result in a faulty connection. This is especially true because the line and load connectors are also fixed to the bus bars and are therefore not rotatable to accommodate the wires.

Another shortcoming with present transockets is that they are difficult to service because wires coupled to the meter socket must be disconnected in order to reach the bus bars. What's more, even when the wires are disconnected from the meter socket, the door on which the socket is mounted is typically hinged and thus can still prevent full access to the bus bars.

SUMMARY OF THE INVENTION

The present invention eliminates the above difficulties and disadvantages by providing a utility metering transocket for mounting to a wall and for receiving a line wire and a load wire therein. The transocket has a bottom side, a back side, a top side, a top cover at least partially covering the back side, and opposing sides coupled to the bottom, back, and top sides. A plurality of bus bars of differing length are mounted to the back side, each bus bar having a load connector and a spaced apart line connector secured thereon.

The plurality of bus bars are further arranged toward one of the opposing sides of the transocket thereby providing increased space within the transocket for routing the line wire and the load wire within the transocket such that the line wire and the load wire can be gradually bent for coupling to the line connector and the load connector, respectively, of at least one of the plurality of bus bars. Rotating line and load connectors are disposed on the bus bars to further aid in routing. Two spaced apart pan supports are mounted on the opposing sides of the transocket, the two pan supports have at least one raised screw mounted thereon. A pan is also provided that has a meter socket disposed thereon and a plurality of key apertures for receiving the at least one raised screw therein for releasably mounting the pan on the pan supports.

A connector aperture is disposed in one of the opposing sides and a wire cutout is adjacent thereto and partially covered by the top cover. A transformer connector is secured in the connector aperture and has a plurality of bus bar wires electrically and mechanically coupled thereto. A meter connector is releasably secured in the connector aperture and to the transformer connector. The meter connector has a plurality of meter socket wires electrically and mechanically coupled thereto. The meter socket wires extend from the meter connector through the wire cutout. When the top cover is removed from the transocket, the meter connector can be released from the transformer connector such that easy access is obtained to the bus bars of the transocket when the pan is removed from the pan supports.

DETAILED DESCRIPTION OF THE PREFERRED EMBODIMENTS

Figure 1:
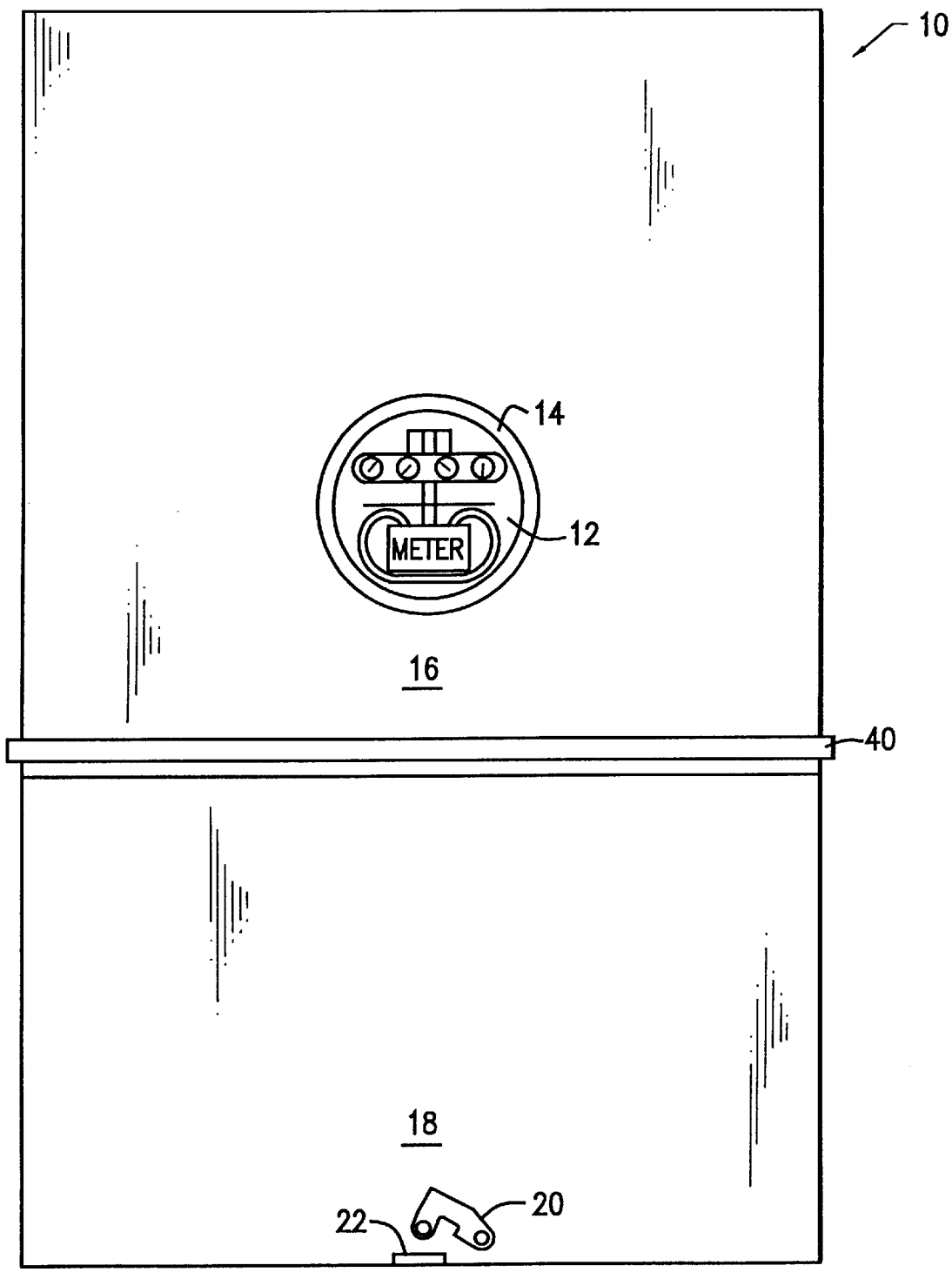
FIG. 1 is a front plan view of the transocket of the present invention with meter installed.

The above and other features, aspects, and advantages of the present invention will now be discussed in the following detailed description and appended claims, which are to be considered in conjunction with the accompanying drawings in which identical reference characters designate like elements throughout the views. Shown in FIG. 1 is a utility metering transocket 10 for mounting to a wall. The transocket 10 is preferably constructed of a non-corrosive material, which as is preferably galvanized steel but could also be stainless steel, and has a meter 12 mounted therein, which protrudes through an opening in a top cover 16 of the transocket 10. The top cover 16 is partially held in place by an overhanging lip of the top side 26 and is further secured and supported by a cross bar 40, which is attached to the transocket 10 via screws. Also, the cross bar 40 helps retain the upper portion of the bottom cover 18 against the transocket 10. The meter 12 is surrounded at the protrusion point by a sealing ring 14. Disposed below the top cover 16 is a bottom cover 18 with an aperture through which an eyelet 22 protrudes. A rotatable latch 20 is insertable through the eyelet 22 for securing the bottom cover 18 to the transocket 10. The latch 20 is preferably constructed of stainless steel.

Figure 2:
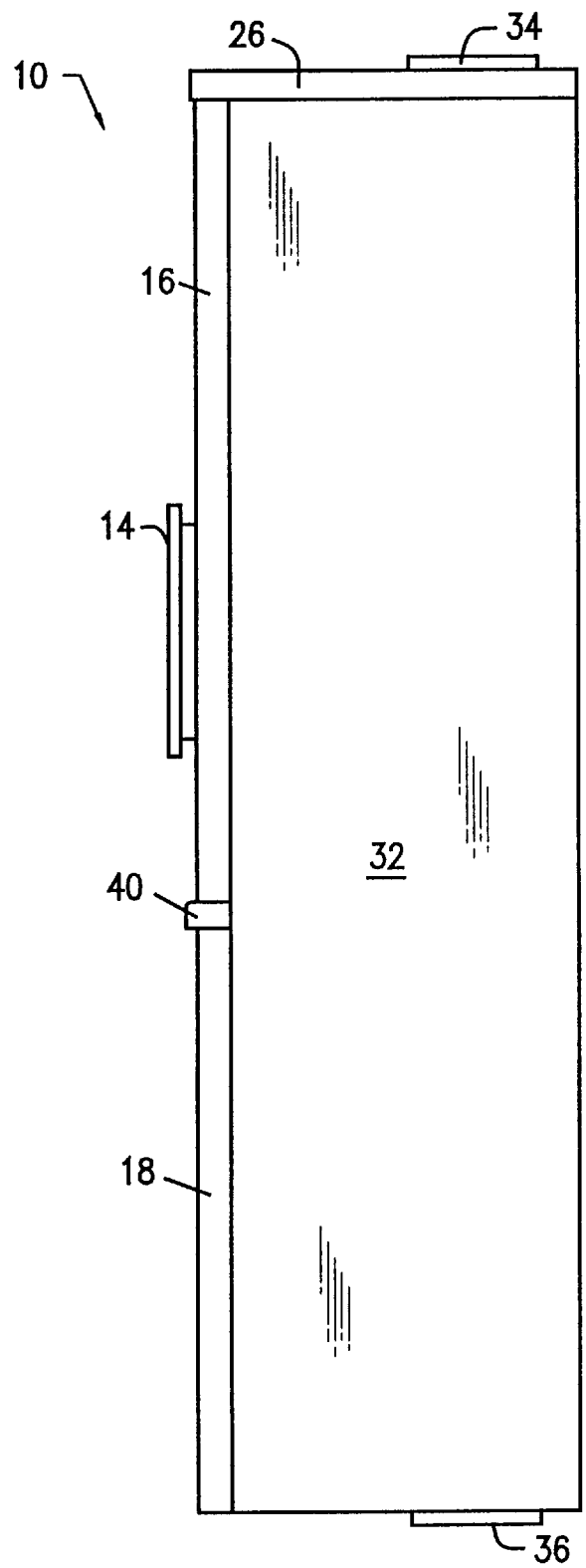
FIG. 2 is a right side elevational view of the transocket of the present invention.
Figure 3:
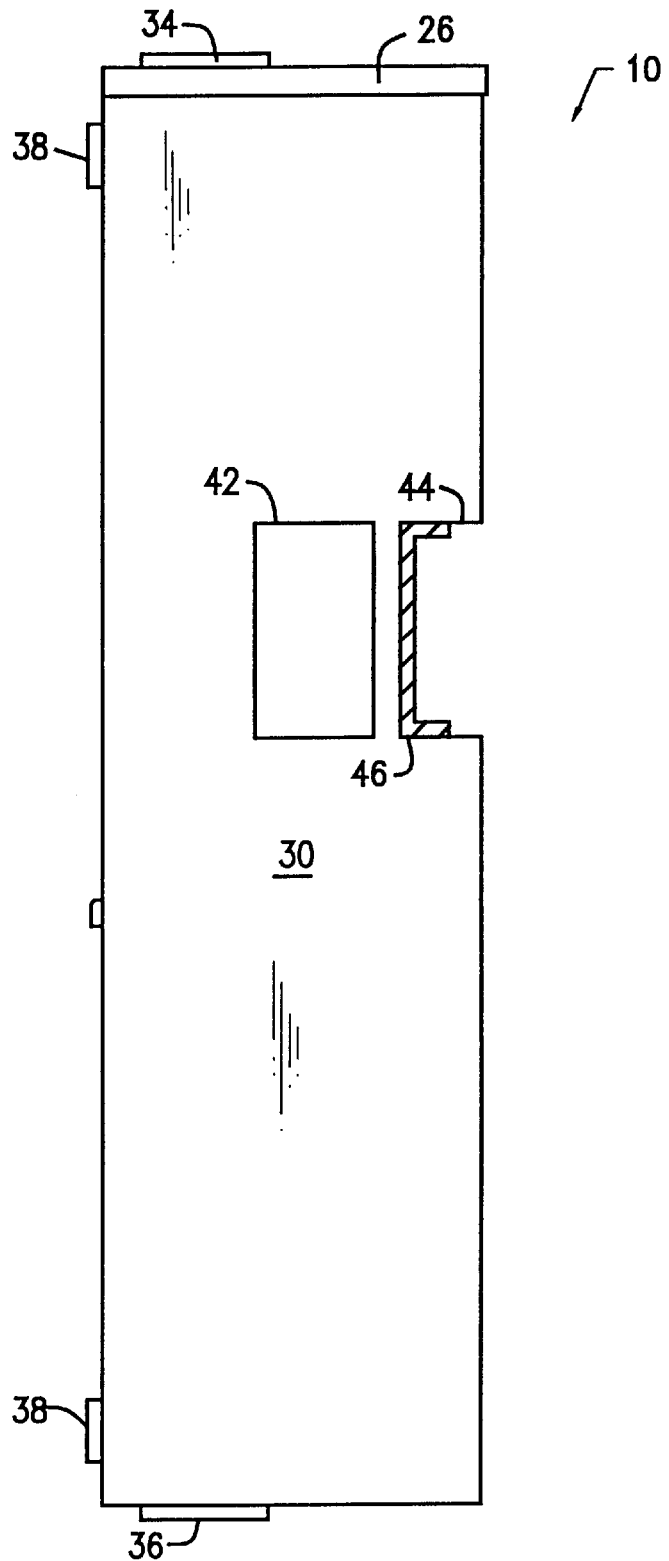
FIG. 3 is a right side elevational view of the transocket of the present invention.

As shown in FIG. 2, the transocket 10 has a right side 32 and a top side 26. Mounting embosses 38 are used to receive a nail or screw therein for mounting the transocket 10 to the wall. Shown in FIG. 3 is the left side 30 of the transocket 10. As shown in FIGS. 2, 2A, 3, 4, 5, 6, 9, 10, 11, and 12, the transocket 10 has a bottom side 24 with four evenly spaced bottom cutouts 36 disposed therein, which preferably consist of perforated, annular rings. Similarly, shown in FIGS. 2, 2B, 3, 4, 5, 6, 9, 10, 11, and 12, the transocket 10 has a top side 26 with four evenly spaced top cutouts 34 disposed therein, which preferably consists of perforated, annular rings. The top cutouts 34 and bottom cutouts 36, when removed, allow for the receiving of a line wire 82 and a load wire 84, or a plurality of line and load wires 82, 84 therein. The line wire 82 and the load wire 84 are typically contained within a metal conduit that is secured, at least partially, to the wall and which also can be fed into one of the cutouts 34. The receiving of line and load wires 82, 84 into and out of the transocket 10 will be discussed in greater detail below. The transocket 10 also has a back side 28, as shown in FIGS. 5, 9, 10, 11, and 12 in which the mounting embosses 38 are formed. The top cover 16 at least partially covers the back side 28. The left side 30 and right side 32 of the transocket 10 are opposing and coupled to the bottom side 24, back side 28, and top side 26.

Figure 4:
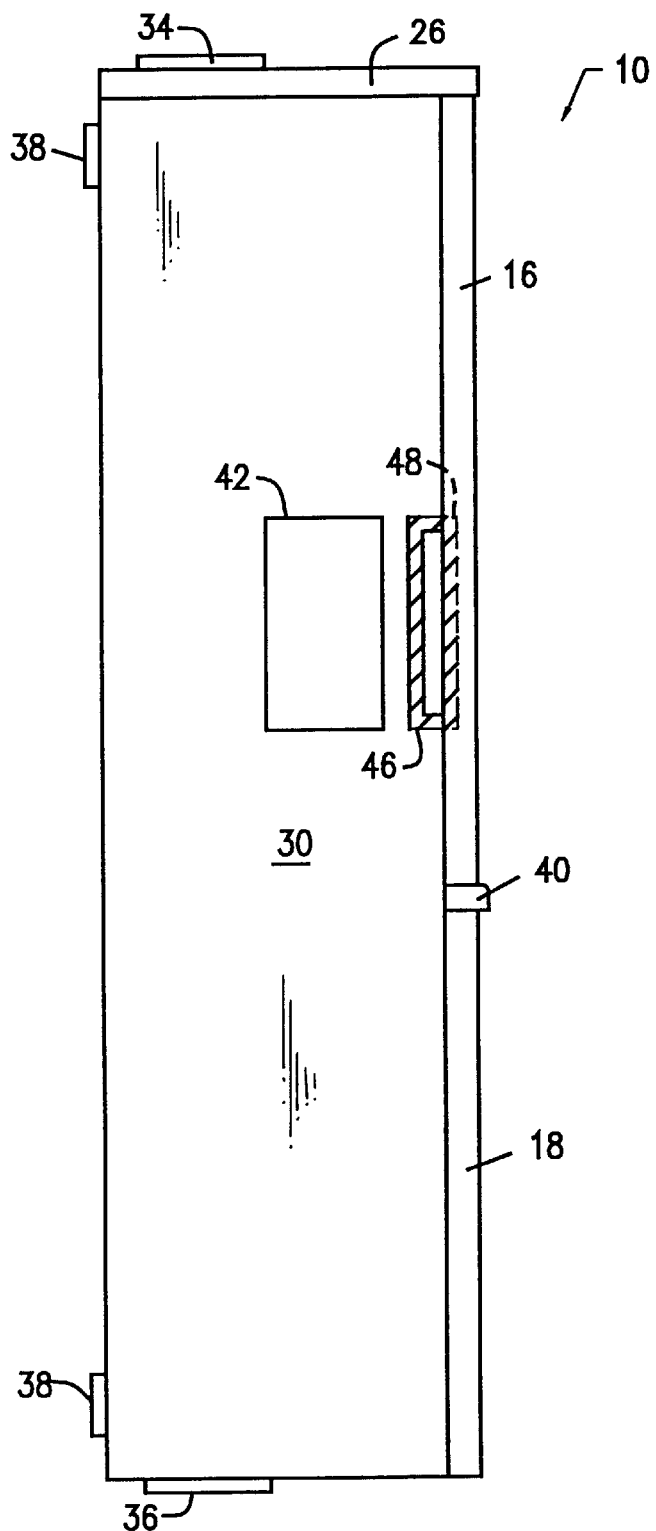
FIG. 4 is a left side elevational view of the transocket of the present invention showing a connector aperture disposed therein.
Figures 6, 7:
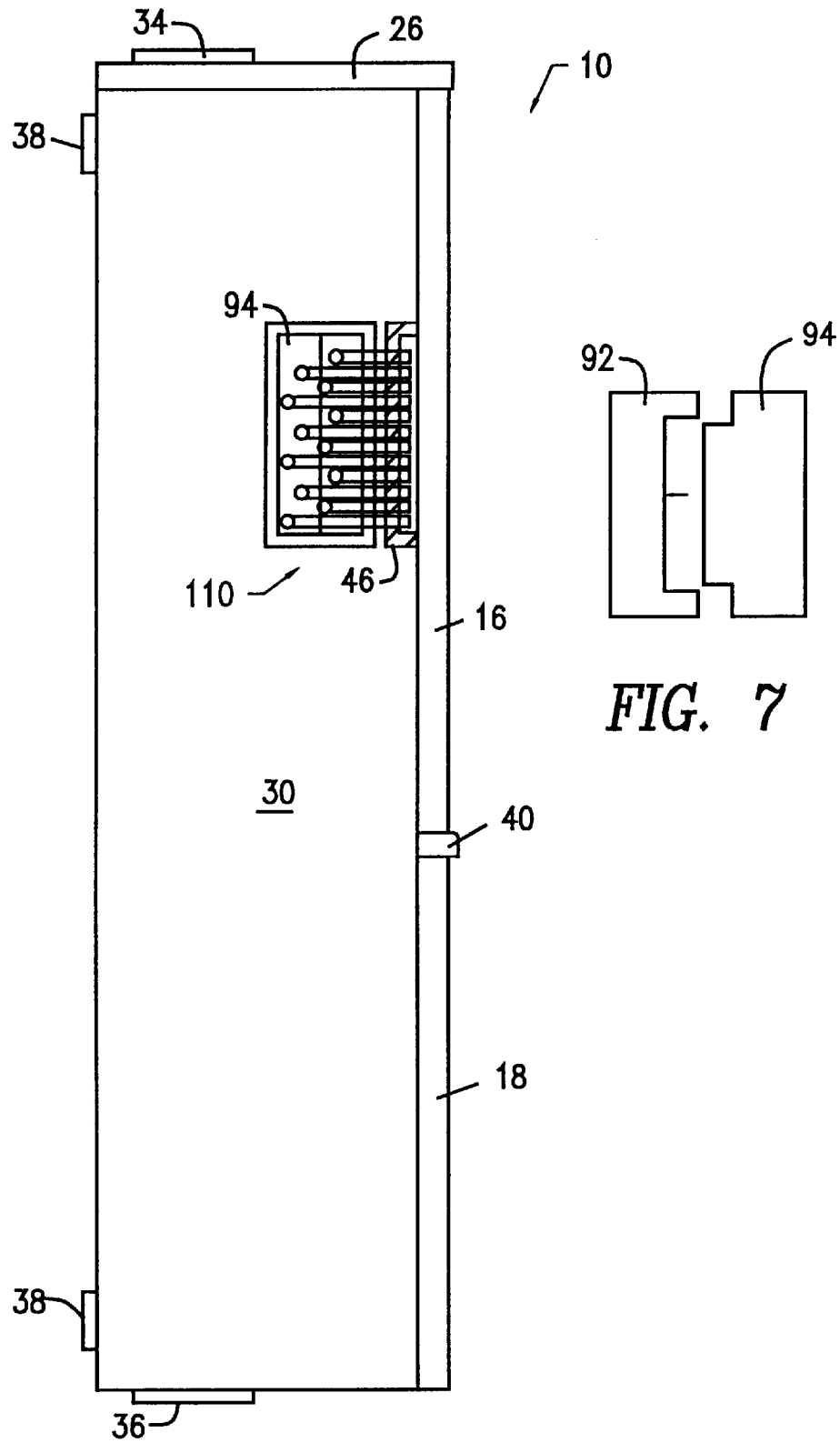
FIG. 6 is a left side elevational view of the transocket of the present invention showing a meter connector disposed therein.
FIG. 7 is a side elevational view of the meter connector mating to a transformer connector of the present invention.

As further shown in FIG. 3, disposed in the left side 30, but which could also be disposed in another side of the transocket 10, is a connector aperture 42 and an adjacent wire cutout 44. A first wire seal 46 is partially disposed about the wire cutout 44 and attached thereto via a weatherproof adhesive. As shown in FIG. 4, a second wire seal 48 is attached to the top cover 16, also preferably by a weatherproof adhesive. The utility metering transocket 10 further includes a meter connector 94 releasably secured in the connector aperture 42, as shown in FIG. 6, and that has a plurality of meter socket wires 110 electrically and mechanically coupled thereto. The meter socket wires 110 extend from the meter connector 94, where they are terminated, through the wire cutout 44, and are terminated at the other end in a ten pole test switch 58, which is electrically coupled to the meter socket 54 as will be discussed below. The meter connector 94 is preferably manufactured by the Thomas & Betts Corporation, which has a principal place of business at 8155 T&B Boulevard, Memphis, Tenn. 38125, under the trademark POS-E-KON. A mating connector to which meter connector 94 is releasably secured as will be discussed below.

Figure 5:
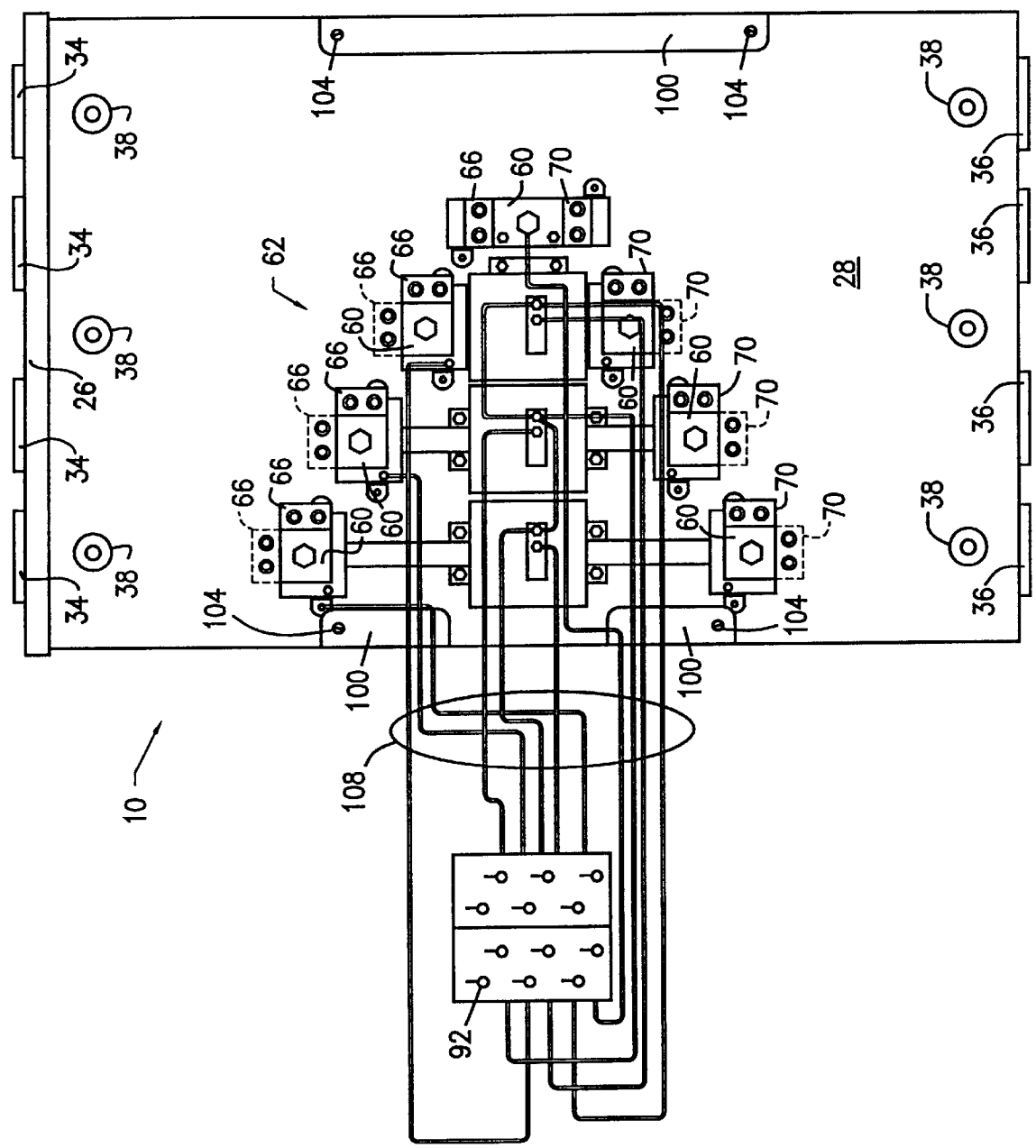
FIG. 5 is a plan view of the interior of the transocket of the present invention.
Figure 8:
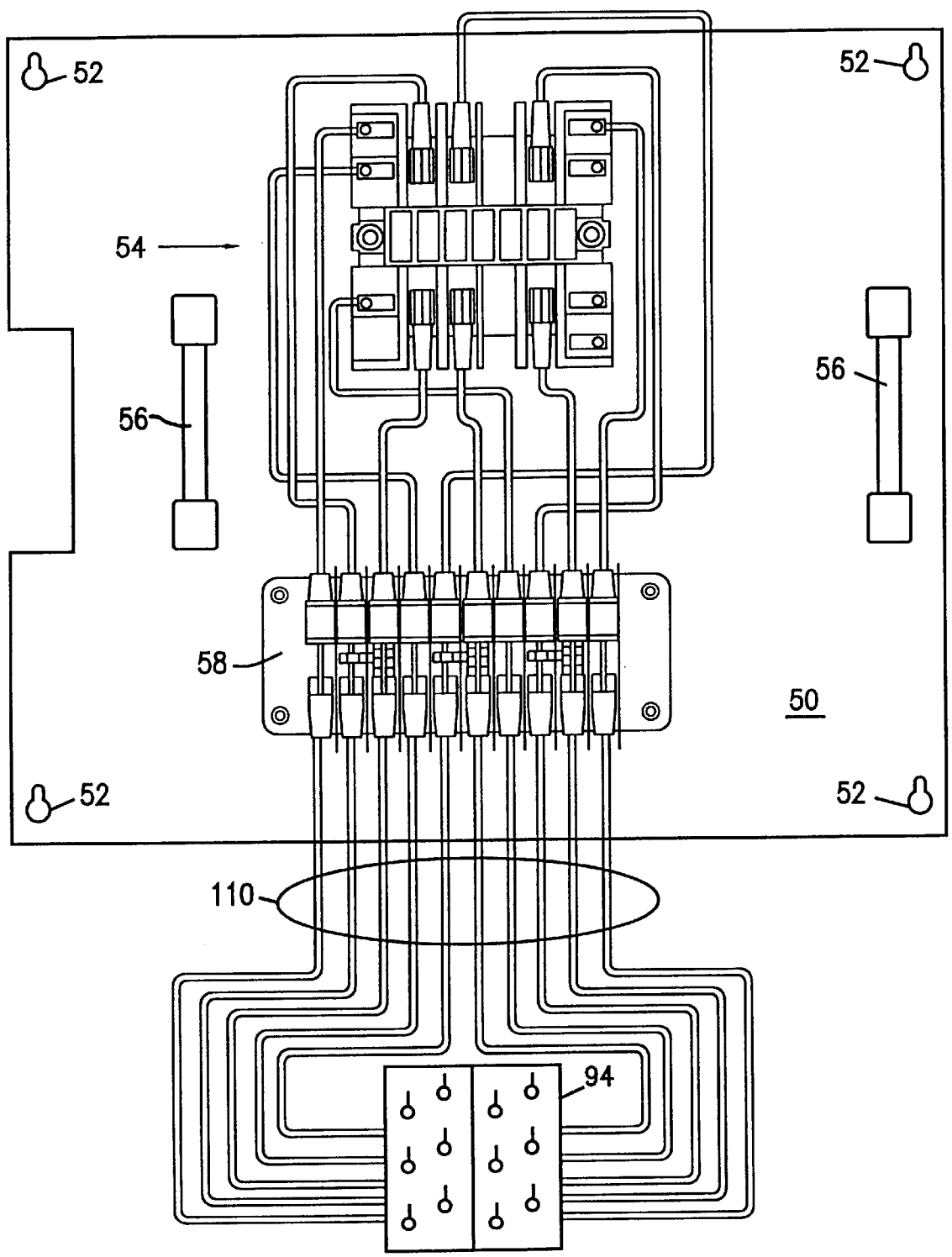
FIG. 8 is plan view of a pan and attached meter socket of the present invention.

As shown in FIG. 5, the utility metering transocket 10 further comprises a pan support 100 mounted on the opposing sides of the transocket 10, each of the pan supports 100 have at least one raised screw 104 mounted thereon for being received through key apertures 52 of a pan 50, as shown in FIG. 8. The pan 50 has a meter socket 54 mounted thereon and is releasably secured on the pan supports 100. The pan 50 has a handle 56 mounted on each side for aiding in removal of the pan 50 from the transocket 10. Moreover, a ten pole test switch 58 is also mounted on the pan 50 and connected to the meter socket 54 via wires on one side and to the meter connector 94 via meter socket wires 110 on another side.

As shown in FIGS. 5 and 7, a transformer connector 92 is secured in the connector aperture 42 preferably via a weatherproof epoxy or friction fit and has a plurality of bus bar wires 108 electrically and mechanically coupled thereto. The transformer connector 92 is also preferably manufactured by the Thomas & Betts Corporation, which has a principal place of business at 8155 T&B Boulevard, Memphis, Tenn. 38125, under the trademark POS-E-KON and is a mating connector to the meter connector 94. The transformer connector 92 couples to the meter connector 94 via press-fit or friction fit as shown in FIG. 7, thereby electrically coupling the meter socket wires 110 to the bus bar wires 108. Bus bar wires 108, which are terminated in the transformer connector 92 in the interior of the transocket 10, extend from the transformer connector 92 to a three-phase current transformer 62, as shown in FIG. 5. When the top cover 16 is removed, the meter connector 94 can be released from the transformer connector 92 and the pan 50 removed, with meter 12 attached to the meter socket 54, from the pan supports 100 such that easy access is obtained to the bus bars of the transocket 10 by a service technician.

Figure 9:
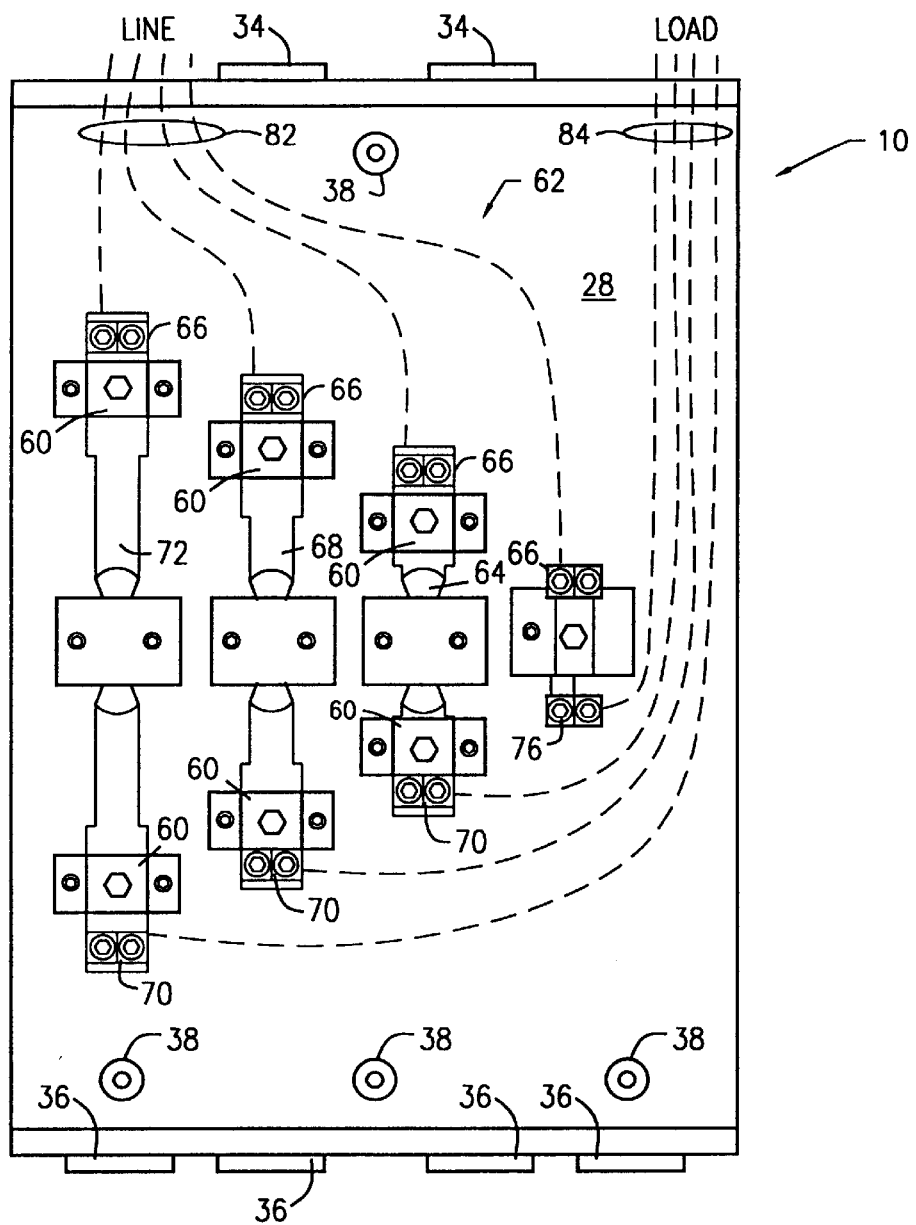
FIG. 9 is a plan view of the interior of the transocket of the present invention showing a transformer disposed therein with both line and load wires entering the transocket from above.
Figure 2A:
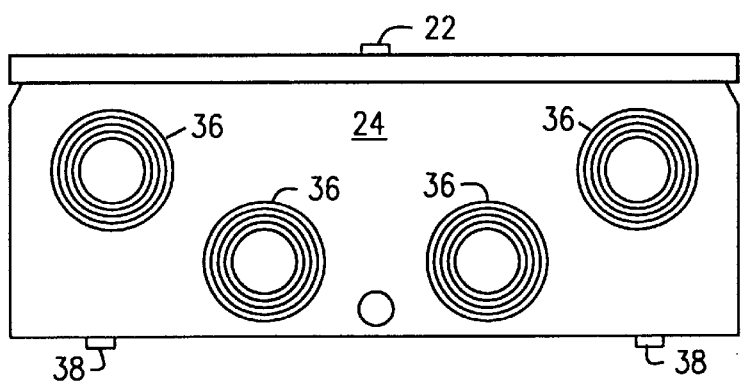
FIG. 2A is a bottom side elevational view of the transocket of the present invention.
Figure 11:
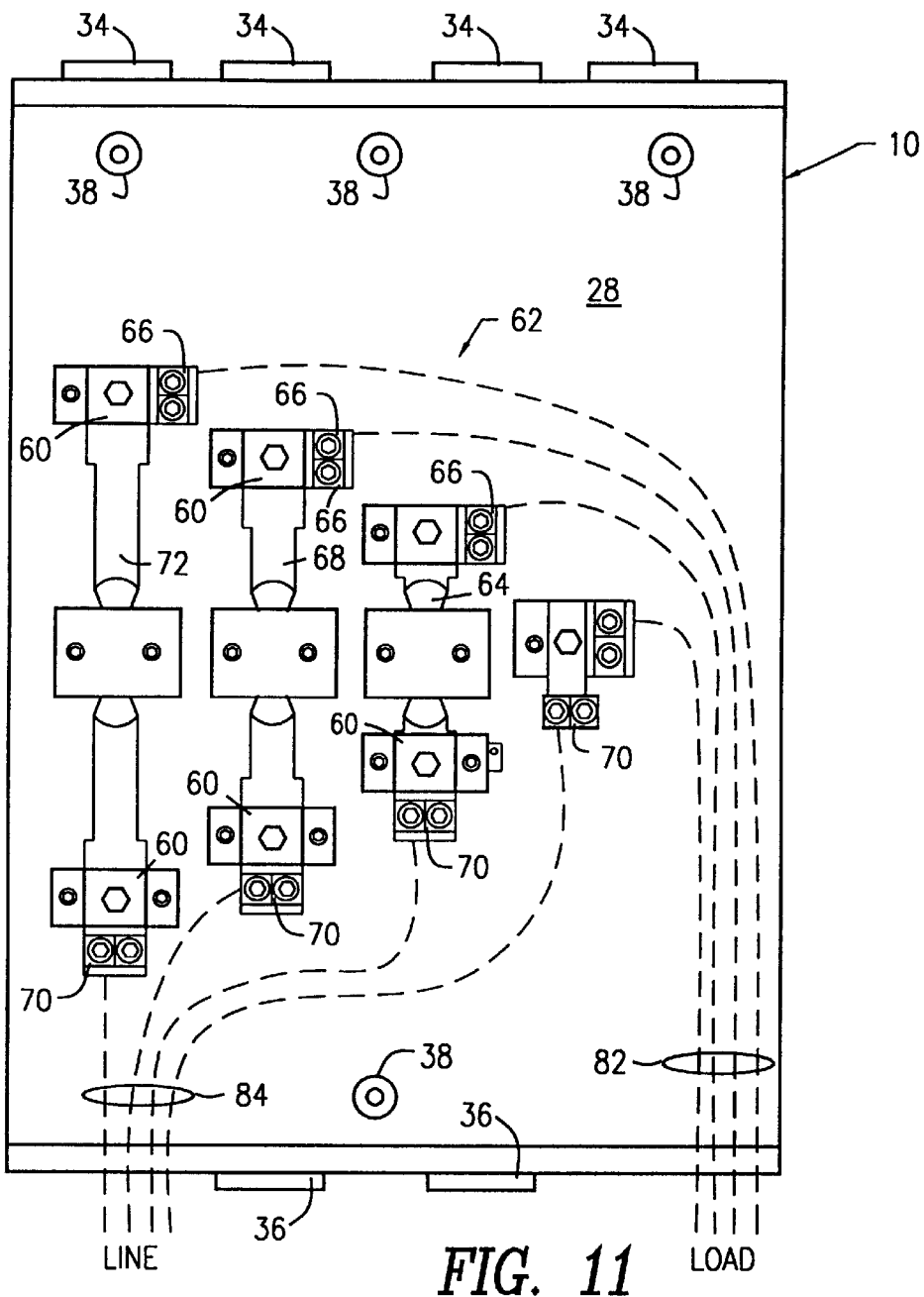
FIG. 11 is a plan view of the interior of the transocket of the present invention showing a transformer disposed therein with both line and load wires entering the transocket from below.
Figure 2B:
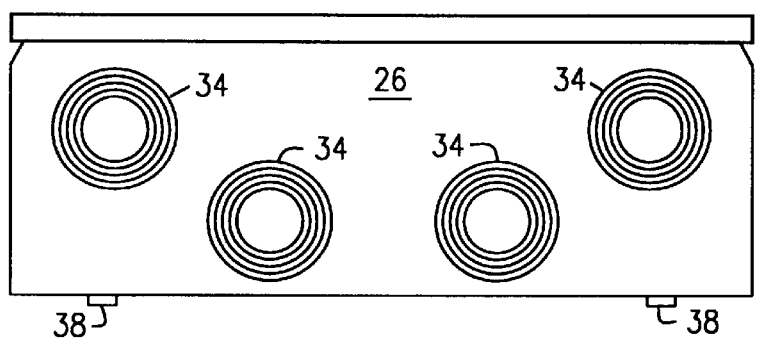
FIG. 2B is a top side elevational view of the transocket of the present invention.
Figure 10:
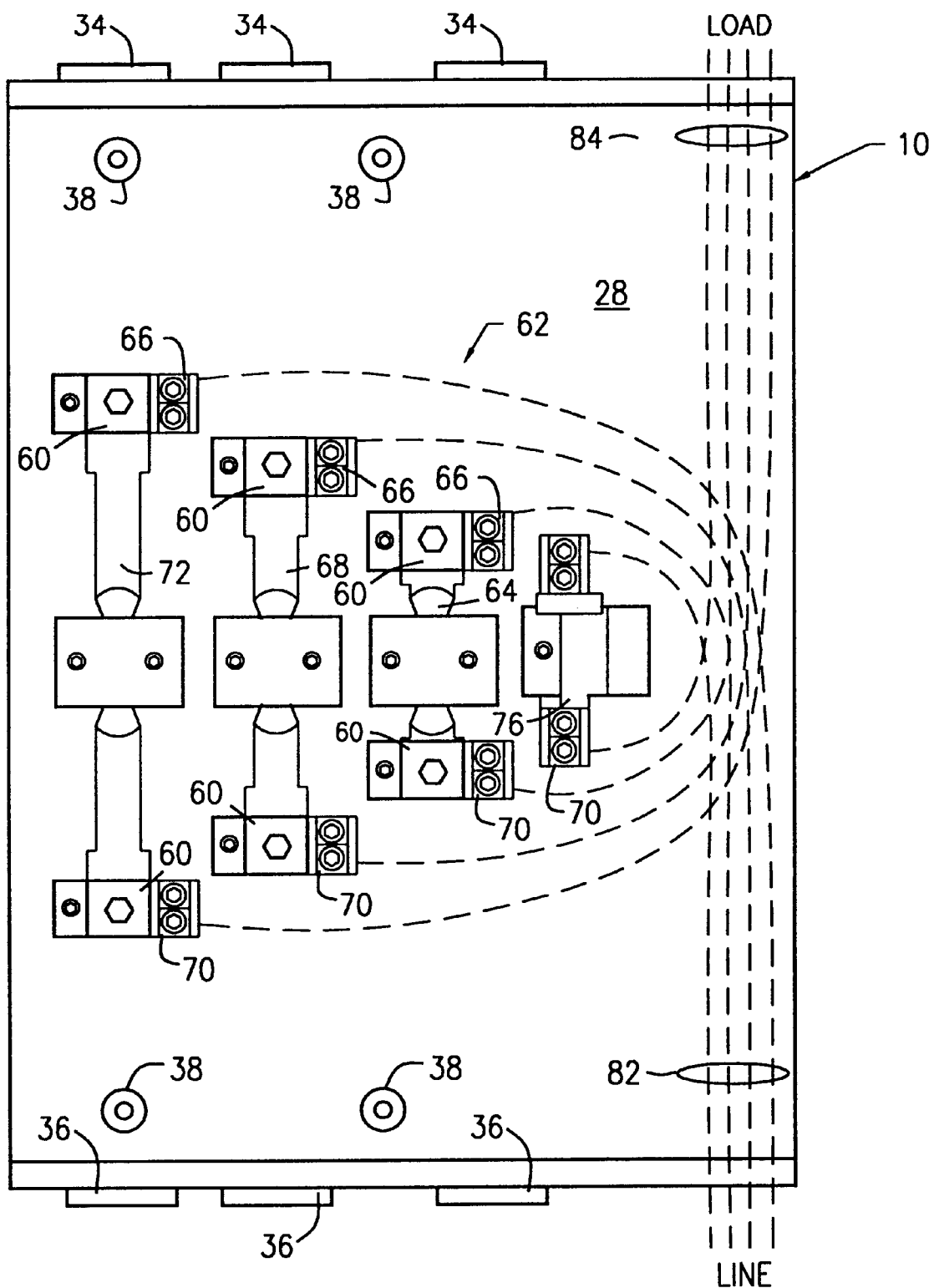
FIG. 10 is a plan view of the interior of the transocket of the present invention showing a transformer disposed therein with load wires entering the transocket from above and line wires entering the transocket from below.
Figure 12:
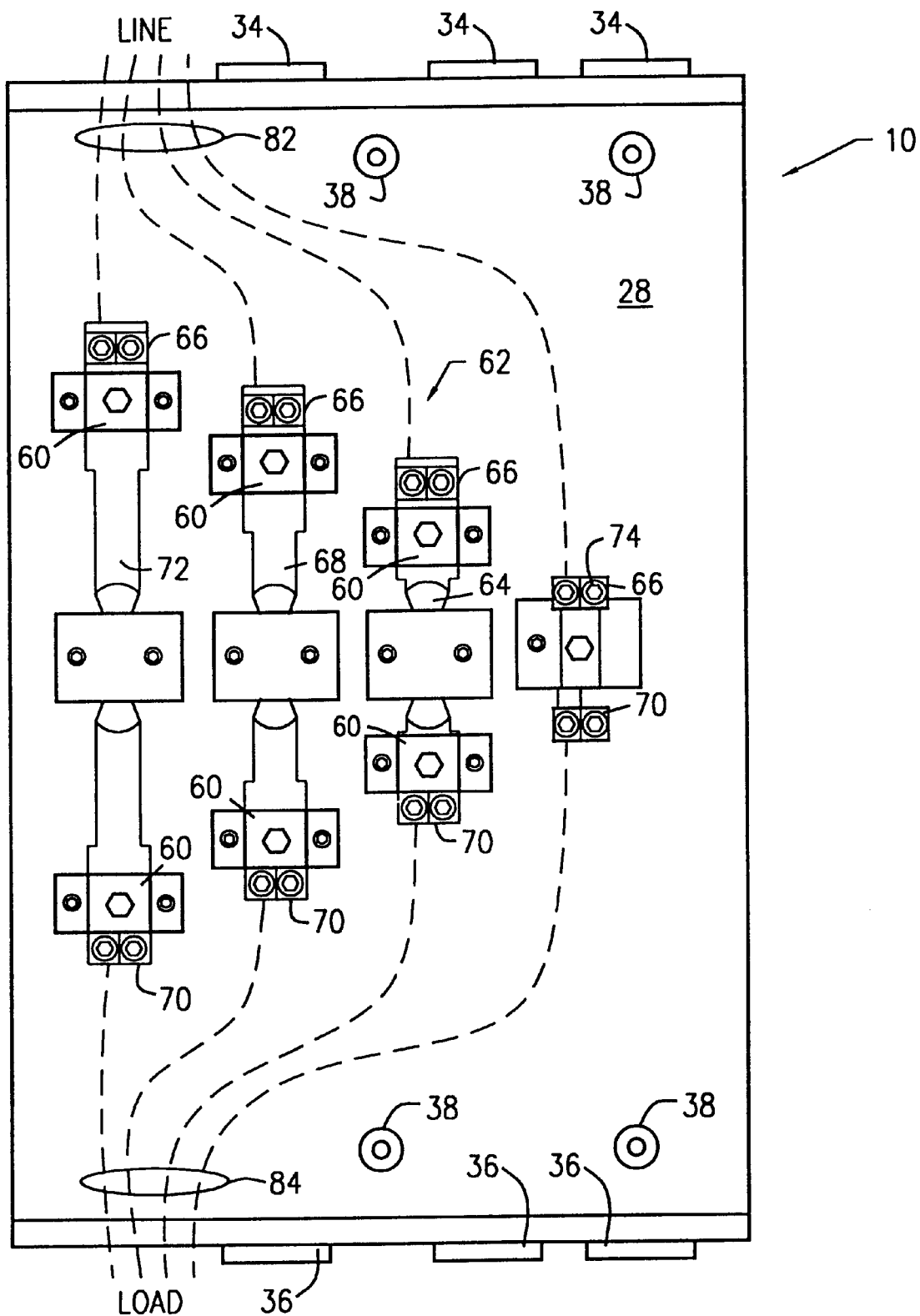
FIG. 12 is a plan view of the interior of the transocket of the present invention showing a transformer disposed therein with load wires entering the transocket from below and line wires entering the transocket from above.
Figure 13:
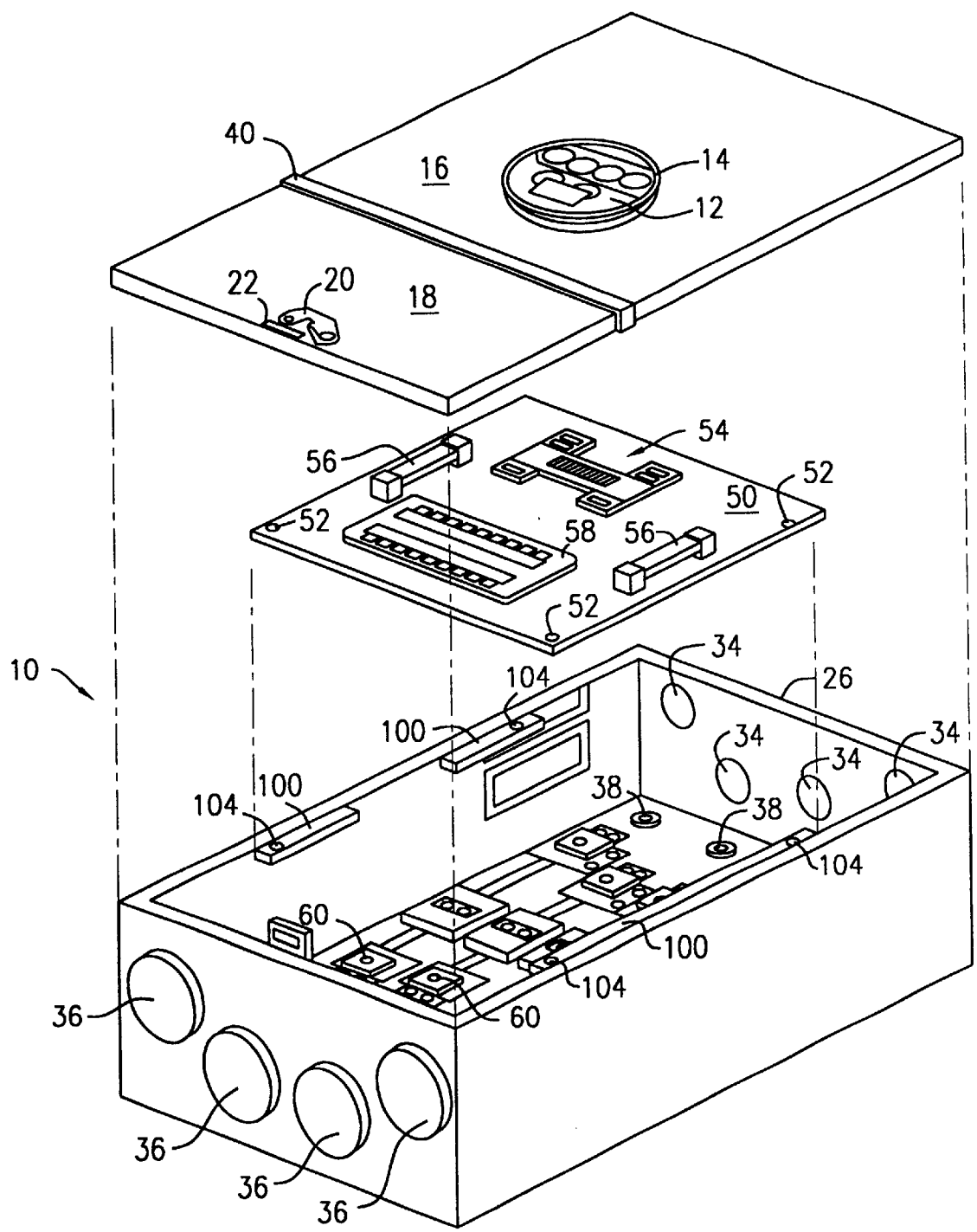
FIG. 13 is an exploded view of the transocket of the present invention.

The current transformer 62 has a plurality of bus bars of differing length mounted to the back side 28 of the transocket 10. In particular, the bus bars include a first-phase bus bar 64, a second-phase bus bar 68, a third-phase bus bar 72, and a neutral bus bar 76. Each bus bar has a load connector 70 and a spaced apart line connector 66 secured thereon, the plurality of bus bars further being arranged toward one of the opposing sides of the transocket 10 thereby providing increased space within the transocket 10 for routing the line wire 82 and the load wire 84, such that the line wire 82 and the load wire 84 can be gradually bent for coupling to the line connector 66 and the load connector 70, respectively, of at least one of the plurality of bus bars. For example, in FIG. 9 is shown the situation where a line wire 82 feed is introduced into the transocket 10 from above, typically from an overhead utility pole and the load wire 84 is returned from the transocket 10 to service the upper level of an apartment. In this instance, two or more of the top cutouts 34 will be removed with the bottom cutouts 36 being left intact. Shown in FIG. 10 is an example of the line wire 82 feed from underground and a return load wire 84 feed to service the upper level of an apartment. In FIG. 11 is shown a situation converse from that shown in FIG. 9 with a line wire 82 feed from underground or below and a return load wire 84 feed to below. In this instance, two or more of the bottom cutouts 36 will be removed with the top cutouts 34 being left intact. Finally, in FIG. 12 is shown the example of an overhead line wire 82 feed and a below load wire 84 return from the transocket 10.

The line connector 66 and the load connector 70 are rotatable ninety degrees, as is best shown in FIG. 5, for further routing the line wire 82 and the load wire 84 such that the line wire 82 and the load wire 84 can be gradually bent for coupling to the line connector 66 and the load connector 70, respectively. In particular, at each end of each bus bar is a central lug 60 that can be easily loosened with an Allen wrench and the corresponding line connector 66 and load connector 70 rotated to its desired position, which is also shown in FIGS. 9, 10, 11, and 12.

Although the invention has been described in detail above, it is expressly understood that it will be apparent to persons skilled in the relevant art that the invention may be modified without departing from the spirit of the invention. Various changes of form, design, or arrangement may be made to the invention without departing from the spirit and scope of the invention. Therefore, the above mentioned description is to be considered exemplary, rather than limiting, and the true scope of the invention is that defined in the following claims.

What is claimed is:

1. A utility metering transocket for mounting to a wall and for receiving a line wire and a load wire therein, the transocket having a bottom side, a back side, a top side, a top cover at least partially covering the back side, and opposing sides coupled to the bottom, back, and top sides, the transocket further comprising:

a plurality of bus bars each of differing length mounted to the back side of the transocket and being arranged in descending order away from one of the opposing sides, each bus bar having a load connector and a spaced apart line connector secured thereon, the plurality of bus bars further being arranged toward one of the opposing sides of the transocket thereby providing increased space within the transocket for routing the line wire and the load wire, such that the line wire and the load wire can be gradually bent for coupling to the line connector and the load connector, respectively, of at least one of the plurality of bus bars.

2. The utility metering transocket of claim 1 further comprising four cutouts disposed on the top side of the transocket for introducing one of the line and the load wires therein when removed.

3. The utility metering transocket of claim 1 further comprising four cutouts disposed on the bottom side of the transocket for introducing one of the line wire and the load wire therein when removed.

4. The utility metering transocket of claim 1 wherein the line connector and the load connector are rotatably positionable at least ninety degrees in relation to at least one bus bar for further routing the line wire and the load wire such that the line wire and the load wire can be gradually bent for coupling to the line connector and the load connector, respectively.

5. The utility metering transocket of claim 1 further comprising a pan support mounted on the opposing sides of the transocket, each of the pan supports having at least one raised screw mounted thereon.

6. The utility metering transocket of claim 5 further comprising a pan having a meter socket disposed thereon and a plurality of key apertures for receiving the at least one raised screw therein for releasably mounting the pan on the pan supports.

7. The utility metering transocket of claim 6 further comprising a connector aperture disposed in one of the opposing sides and a wire cutout adjacent thereto and partially covered by the top cover.

8. The utility metering transocket of claim 7 further comprising a transformer connector secured in the connector aperture and having a plurality of bus bar wires electrically and mechanically coupled thereto.

9. The utility metering transocket of claim 8 further comprising a meter connector releasably secured in the connector aperture and to the transformer connector and having a plurality of meter socket wires electrically and mechanically coupled thereto, the meter socket wires extending from the meter connector through the wire cutout.

10. The utility metering transocket of claim 9 wherein when the top cover is removed, the meter connector can be released from the transformer connector and the pan removed from the pan supports such that easy access is obtained to the bus bars of the transocket.

11. A utility metering transocket for mounting to a wall and for receiving a line wire and a load wire therein, the transocket having a bottom side, a back side, a top side, a top cover at least partially covering the back side, and opposing sides coupled to the bottom, back, and top sides, the transocket further comprising:

a plurality of bus bars mounted to the transocket, each bus bar having a load connector and a spaced apart line connector;

a connector aperture disposed in one of the sides of the transocket:

a transformer connector secured in the connector aperture and having a plurality of bus bar wires electrically and mechanically coupled thereto; and a meter connector releasably secured in the connector aperture and to the transformer connector and having a plurality of meter socket wires electrically and mechanically coupled thereto, the meter socket wires extending from the meter connector through the wire cutout.

12. The utility metering transocket of claim 11 wherein the plurality of bus bars are of differing length, the plurality of bus bars further being arranged toward one of the opposing sides of the transocket thereby providing increased space within the transocket for routing the line wire and the load wire and such that the line wire and the load wire can be gradually bent for coupling to the line connector and the load connector, respectively, of at least one of the plurality of bus bars.

13. The utility metering transocket of claim 11 further comprising two spaced apart pan supports mounted on the opposing sides of the transocket, the two pan supports having at least one raised screw mounted thereon.

14. The utility metering transocket of claim 11 further comprising a pan having a meter socket disposed thereon and a plurality of key apertures for receiving the at least one raised screw therein for releasably mounting the pan on the pan supports.

15. The utility metering transocket of claim 11 further comprising a wire cutout adjacent thereto and partially covered by the top cover and wherein the line connector and the load connector of each bus bar are rotatable for further routing the line wire and the load wire, such that the line wire and the load wire can be gradually bent for coupling to the line connector and the load connector, respectively.

16. The utility metering transocket of claim 11 wherein when the top cover is removed, the meter connector can be released from the transformer connector and the pan removed from the pan supports such that easy access is obtained to the bus bars of the transocket.

17. A utility metering transocket for mounting to a wall and for receiving a line wire and a load wire therein, the transocket having a bottom side, a back side, a top side, a top cover at least partially covering the back side, and opposing sides coupled to the bottom, back, and top sides, the transocket further comprising:

a plurality of bus bars each of differing length mounted to the back side of the transocket;

a connector aperture disposed in one of the opposing sides and a wire cutout adjacent thereto and partially covered by the top cover;

a transformer connector secured in the connector aperture and having a plurality of bus bar wires electrically and mechanically coupled thereto;

a meter connector releasably secured in the connector aperture and to the transformer connector and having a plurality of meter socket wires electrically and mechanically coupled thereto, the meter socket wires extending from the meter connector through the wire cutout; and wherein when the top cover is removed from the transocket, the meter connector can be released from the transformer connector such that easy access is obtained to the bus bars of the transocket.

18. The utility metering transocket of claim 17 wherein each bus bar has a load connector and a spaced apart line connector secured thereon and to which the load wire and line wire are coupled, respectively.

19. The utility metering transocket of claim 17 further comprising a pan support mounted on the opposing sides of the transocket, each of the pan supports having at least one raised screw mounted thereon.

20. The utility metering transocket of claim 19 further comprising a pan having a meter socket disposed thereon and a plurality of key apertures for receiving the at least one raised screw therein for releasably mounting the pan on the pan supports.

21. The utility metering transocket of claim 18 wherein the line connector and the load connector of at least one of the bus bars are rotatably positionable at least ninety degrees in relation to the bus bar for routing the line wire and the load wire such that the line wire and the load wire can be gradually bent for coupling to the line connector and the load connector, respectively.

* * * * *